United States Patent
May

(10) Patent No.: US 7,508,686 B2
(45) Date of Patent: Mar. 24, 2009

(54) SYSTEM AND METHOD FOR CONFIGURING DIRECT CURRENT CONVERTER

(75) Inventor: Marcus W. May, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 525 days.

(21) Appl. No.: 11/170,485

(22) Filed: Jun. 29, 2005

(65) Prior Publication Data

US 2007/0002600 A1 Jan. 4, 2007

(51) Int. Cl.
*H02M 7/00* (2006.01)

(52) U.S. Cl. ......................................... 363/65

(58) Field of Classification Search ................... 363/65, 363/147; 320/106, 116, 120, 121
See application file for complete search history.

(56) References Cited

U.S. PATENT DOCUMENTS

| | | | | |
|---|---|---|---|---|
| 3,864,617 | A * | 2/1975 | Smith et al. | 320/159 |
| 5,274,369 | A * | 12/1993 | Tsunoda et al. | 340/7.32 |
| 5,306,961 | A * | 4/1994 | Leo | 327/530 |
| 5,745,354 | A | 4/1998 | Raza | |
| 6,204,651 | B1 | 3/2001 | Marcus et al. | |
| 6,262,899 | B1 * | 7/2001 | Raddi et al. | 363/37 |
| 6,329,800 | B1 | 12/2001 | May | |
| 6,366,522 | B1 | 4/2002 | May et al. | |
| 6,377,826 | B1 * | 4/2002 | Kaneko | 455/573 |
| 6,404,172 | B1 | 6/2002 | May | |
| 6,844,710 | B2 | 1/2005 | Lipcsei et al. | |
| 2004/0017111 | A1 | 1/2004 | May | |
| 2004/0105284 | A1 | 6/2004 | May | |
| 2004/0107407 | A1 | 6/2004 | Henson et al. | |
| 2004/0113497 | A1 | 6/2004 | May | |
| 2004/0268165 | A1 | 12/2004 | May et al. | |
| 2005/0001603 | A1 | 1/2005 | May | |

FOREIGN PATENT DOCUMENTS

EP 0 287 863 10/1988
EP 0 287 863 A3 10/1988

OTHER PUBLICATIONS

Search Report Under Section 17, UK Patent Application No. GB0524085.8, Feb. 22, 2006 (3 pgs).

* cited by examiner

*Primary Examiner*—Matthew V Nguyen
(74) *Attorney, Agent, or Firm*—Toler Law Group

(57) ABSTRACT

A method and system to determine a battery mode of an integrated circuit device are presented. The battery mode is selected with respect to first and second direct current to direct current converter devices within the integrated circuit. A voltage is received at a single pin of the device. A battery mode is determined for the device based on the received voltage, and at least one of the direct current to direct current converter circuits is configured based on the determined battery mode.

20 Claims, 7 Drawing Sheets

SYSTEM AND METHOD FOR CONFIGURING DIRECT CURRENT CONVERTER

FIELD OF THE DISCLOSURE

The disclosure relates to systems and methods of using a battery to provide a voltage to an integrated circuit.

BACKGROUND

Portable devices may use a battery to provide a voltage to the device components, including components within an integrated circuit. In some cases, it is desirable to modify the voltage provided by the battery in order to provide a system voltage for the device components of the integrated circuit. However, different portable devices use different battery types and configurations. For example, some portable devices use lithium batteries, while others incorporate alkaline or series AA types of battery configurations. Each type of battery may provide a different output voltage to an integrated circuit.

Accordingly, there is a need for a system and method to allow an integrated circuit to be coupled to a variety of battery types and configurations.

DESCRIPTION OF THE DRAWING(S)

A method and system of selecting a battery mode of an integrated circuit device are presented. The battery mode is selected with respect to first and second DC-DC converter devices within the integrated circuit device. A voltage is received at a single pin of the device. A battery mode is determined for the device based on the received voltage and at least one of the DC-DC converter circuits is configured based on the battery mode.

Figure 1:
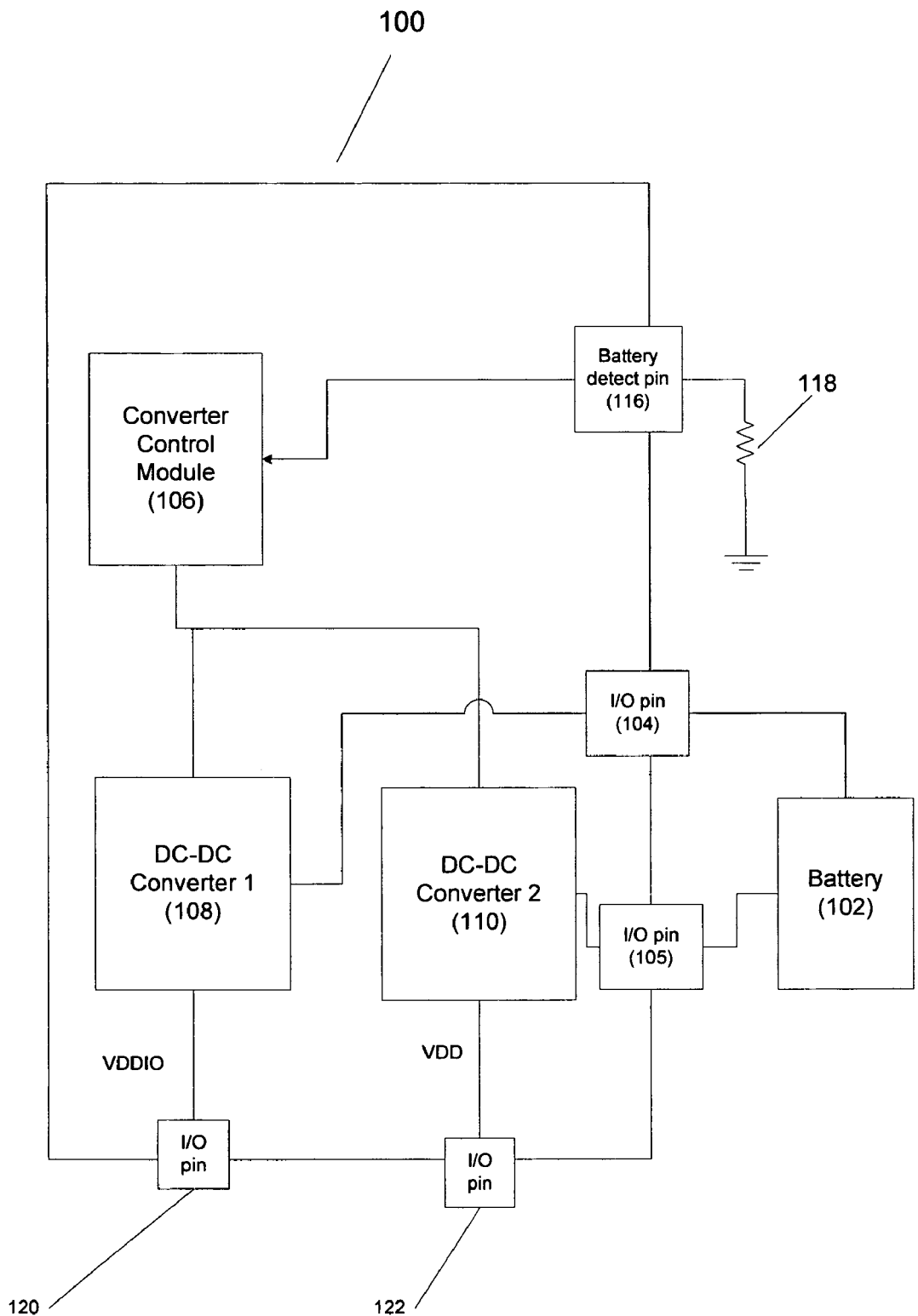
FIG. 1 is a block diagram of an integrated circuit incorporating direct current to direct current (DC-DC) converters in a first configuration.

Referring to FIG. 1, a block diagram of an integrated circuit 100 is illustrated. In a particular embodiment, the integrated circuit 100 is an integrated circuit for a portable electronic device, such as an MP3 player. The integrated circuit 100 is coupled to a battery 102. The integrated circuit 100 includes a plurality of pins, including a first input/output (I/O) pin 104, a second I/O pin 105, and a battery detect pin 116. The integrated circuit 100 further includes a converter control module 106, a first direct current to direct current (DC-DC) converter 108, and a second DC-DC converter 110. The integrated circuit 100 also includes a third I/O pin 120 and a fourth I/O pin 122.

In the configuration illustrated in FIG. 1, the battery 102 provides a voltage to the integrated circuit 100 at the I/O pins 104 and 105. The battery 102 may be any suitable battery or collection of batteries, including a lithium battery, an alkaline battery, or a series AA battery configuration.

The integrated circuit 100 includes DC-DC converters 108 and 110 to convert the voltage received at the first battery input pin 104 and the second battery input pin 105 to an appropriate level for the supply voltage of the integrated circuit 100 (labeled VDD) and for an input/output voltage level (VDDIO). The voltage VDD can be provided at the input/output pin 122 and the voltage VDDIO can be provided at the I/O pin 120.

The battery detect pin 116 is coupled to the converter control module 106. The battery detect pin is also coupled to a resistor 118. The converter control module 106 detects the value of the resistor 118 coupled to the battery detect pin 116 to determine a battery mode. In a particular embodiment, the resistor 118 is set to float, 270 kilo-ohms, 120 kilo-ohms, or ground depending on the type of battery used for the battery 102.

The converter control module 106 is coupled to the first DC-DC converter 108 and to the second DC-DC converter 110. Based on the voltage detected at the battery detect pin 116, the converter control module 106 sends control signals to the first DC-DC converter 108 and to the second DC-DC converter 110 to configure the converters. In a particular embodiment, the converter control module configures the first DC-DC converter 108 into a "boost" or "buck" mode. In a boost mode, the first DC-DC converter 108 amplifies the voltage at the battery input pin 104. In a buck mode, the first DC-DC converter 108 attenuates the voltage at the battery input pin 104. The second DC-DC converter 110 can also be set to a boost or buck mode.

The converter control module 106 can independently set the mode of the first DC-DC converter 108 and the second DC-DC converter 110. Thus, the first DC-DC converter 108 and the second DC-DC converter 110 can be set into a buck-buck configuration, a buck-boost configuration, a boost-boost configuration, a configuration where each converter is in a powered down state, or other configurations.

In a particular embodiment, the first DC-DC converter 108 is arranged in a first selectable configuration corresponding to a selected battery mode determined in response to an input received at the battery detect pin 116, and the second DC-DC converter 110 is arranged in a second selectable configuration based on the selected battery mode. In a particular embodiment, the selected battery mode is selected from at least three different available battery modes. In a particular embodiment, the selected battery mode is selected from four available battery modes. In a particular embodiment, the configuration for each converter is set according to the following table:

| Battery Mode | First DC-DC Converter 108 Configuration | Second DC-DC Converter 110 Configuration |
| --- | --- | --- |
| Lithium Ion | Buck | Buck |
| Series AA | Buck | Boost |
| Single AA (alkaline) | Boost | Off |
| Second lithium ion | Buck and Buck/Boost | Off |

In a particular embodiment, the first DC-DC converter 108 and the second DC-DC converter 110 convert the voltage provided by the battery 102 into the voltages VDD and VDDIO.

The integrated circuit 100 is illustrated in a first configuration. In this configuration, the first DC-DC converter 108 and the second DC-DC converter 110 are coupled via the input/output pin 120 and the input/output pin 122.

Figure 2:
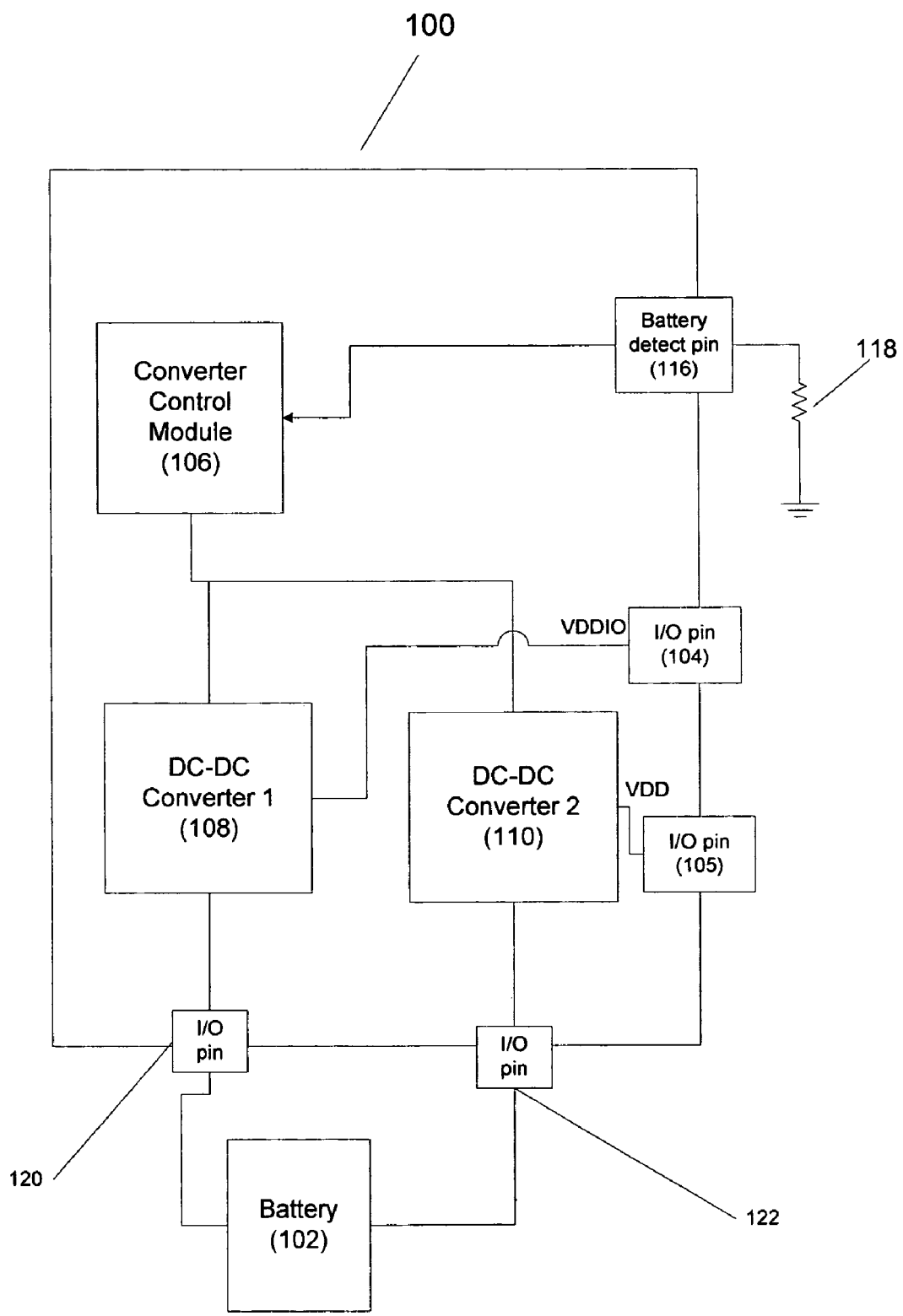
FIG. 2 is a block diagram of an integrated circuit configured incorporating direct current to direct current (DC-DC) converters in a second configuration.

Referring to FIG. 2, the integrated circuit 100 is illustrated in a second configuration. In this configuration the battery 102 is coupled to the input/output pin 120 and the input/output pin 122. In this configuration, the first DC-DC converter 108 provides the voltage VDDIO at the I/O pin 104 and the second DC-DC converter 110 provides the voltage VDD at the I/O pin 105.

Figure 3:
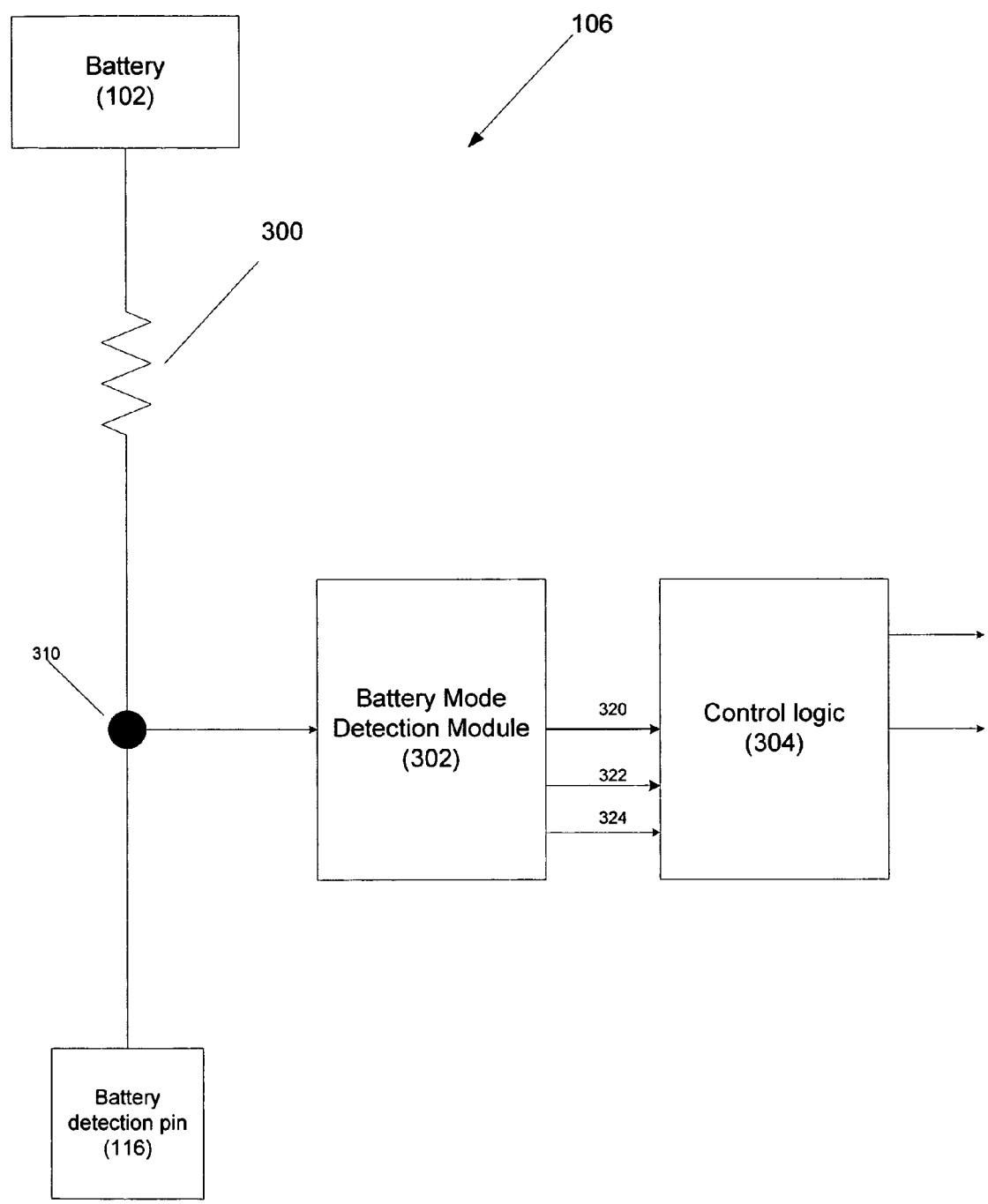
FIG. 3 is a block diagram of a particular embodiment of a converter control module.

Referring to FIG. 3, a particular embodiment of the converter control module 106 is illustrated. The converter control module 106 includes a resistor 300, a battery mode detection module 302, and control logic 304. The resistor 300 is coupled to the battery 102 and to the battery detect pin 116. The resistor 300 is also coupled to the battery mode detection module 302. The battery mode detection module 302 provides the output signals 320, 322 and 324 to the control logic 304. Each output signal corresponds to a single bit of the output of the battery mode detection module 302, such that the battery mode detection module can select four modes using three bits. The control logic 304 may reduce the output signals 320, 322 and 324 to two output bits.

In a particular embodiment, the resistor 300 is set at a very large value. The voltage at the node 310 formed by the resistor 300 and the battery detect pin 116 is sensed by the battery mode detection module 302. The battery mode detection module 302 determines three digital bit values 320, 322 and 324 corresponding to the battery configuration of the battery 102. The three digital bit values 320, 322 and 324 are provided to the control logic 304. The control logic 304 produces control signals for the first DC-DC converter 108 and the second DC-DC converter 110 to place the converters in the appropriate configuration for the detected mode of the battery 102.

In a particular embodiment, at least four different available battery modes are identified by the three digital bit values 320, 322, and 324 derived from an input applied to the battery detect pin 116. In a particular embodiment, the four different available battery modes include a first mode associated with a lithium ion battery. The first mode is detected when the input is at a low voltage level. In a particular embodiment, a fourth mode is associated with a single series double A battery. The fourth mode is detected when the input is at a high voltage level.

In another embodiment, the different available battery modes include a second mode detected by a first intermediate voltage level and a third mode detected by a second intermediate voltage level. In a particular embodiment, the second mode corresponds to a series coupled double A battery.

Figure 4:
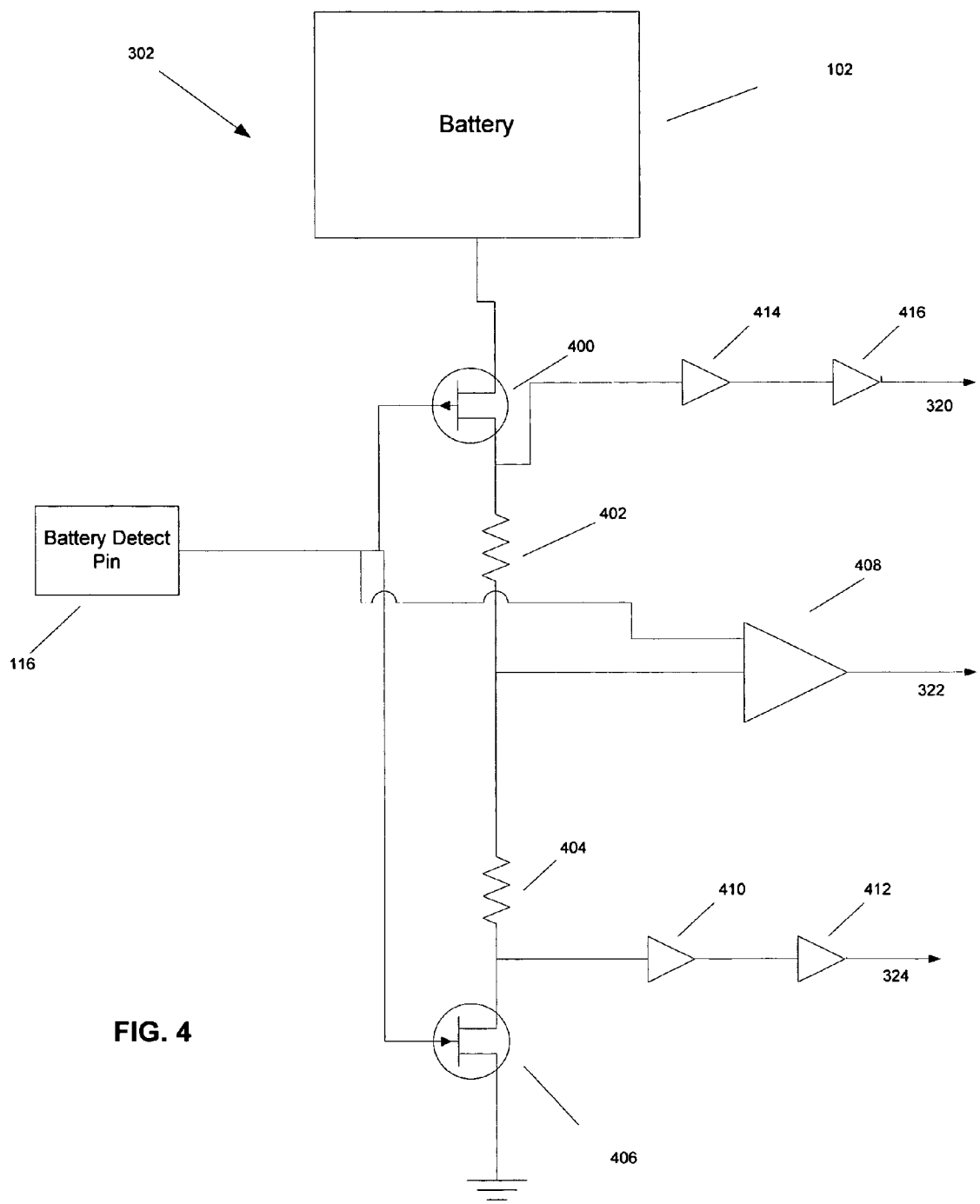
FIG. 4 is a circuit diagram of a particular embodiment of a detection module for use in a converter control module.

Referring to FIG. 4, a particular embodiment of the battery mode detection module 302 is shown. The battery mode detection module 302 includes a first transistor 400, a second transistor 406, logic gates 410, 412, 414 and 416, a comparator 408, and resistors 402, and 404.

The first transistor 400 is coupled to the battery 102 and the battery detect pin 116. The first transistor 400 is further coupled to the resistor 402. The node formed by the first transistor 400 and the resistor 402 is coupled to the logic gate 414. The logic gates 414 and 416 allow the first output signal 320 of the battery mode detection module 402 to be well formed. In a like manner, the logic gates 410 and 412 allow the third output signal 324 to be well formed.

The node formed by the resistor 402 and the resistor 404 is coupled to an input of comparator 408. The second transistor 406 is coupled to ground and to the battery detect pin 116. In a particular embodiment, the second transistor 406 is a low threshold voltage transistor.

In a particular embodiment, the battery detect pin 116 is coupled to an input of the comparator 408. The output of the comparator 408 may correspond to the second output of the battery mode detection module 302, representing a second output bit.

The comparator 408 compares the voltage at the battery detect pin 116 to a reference voltage at the node formed by the resistors 402 and 404. The output of the comparator 408 is based on this comparison. The state of the transistors 400 and 406, and the voltage at the node formed by the resistors 402 and 404 are determined by the voltage at the battery detect pin 116. This voltage determines the state of the outputs 320, 322 and 324.

The output of comparator 408 may be coupled to additional logic gates. In an embodiment, the logic gates 412 and 416 and the logic gates coupled to the comparator 408 provide a three bit digital output that identifies one of four selectable battery modes. In a particular embodiment the comparator 408 is powered down in at least two of the battery modes to conserve power.

Figure 5:
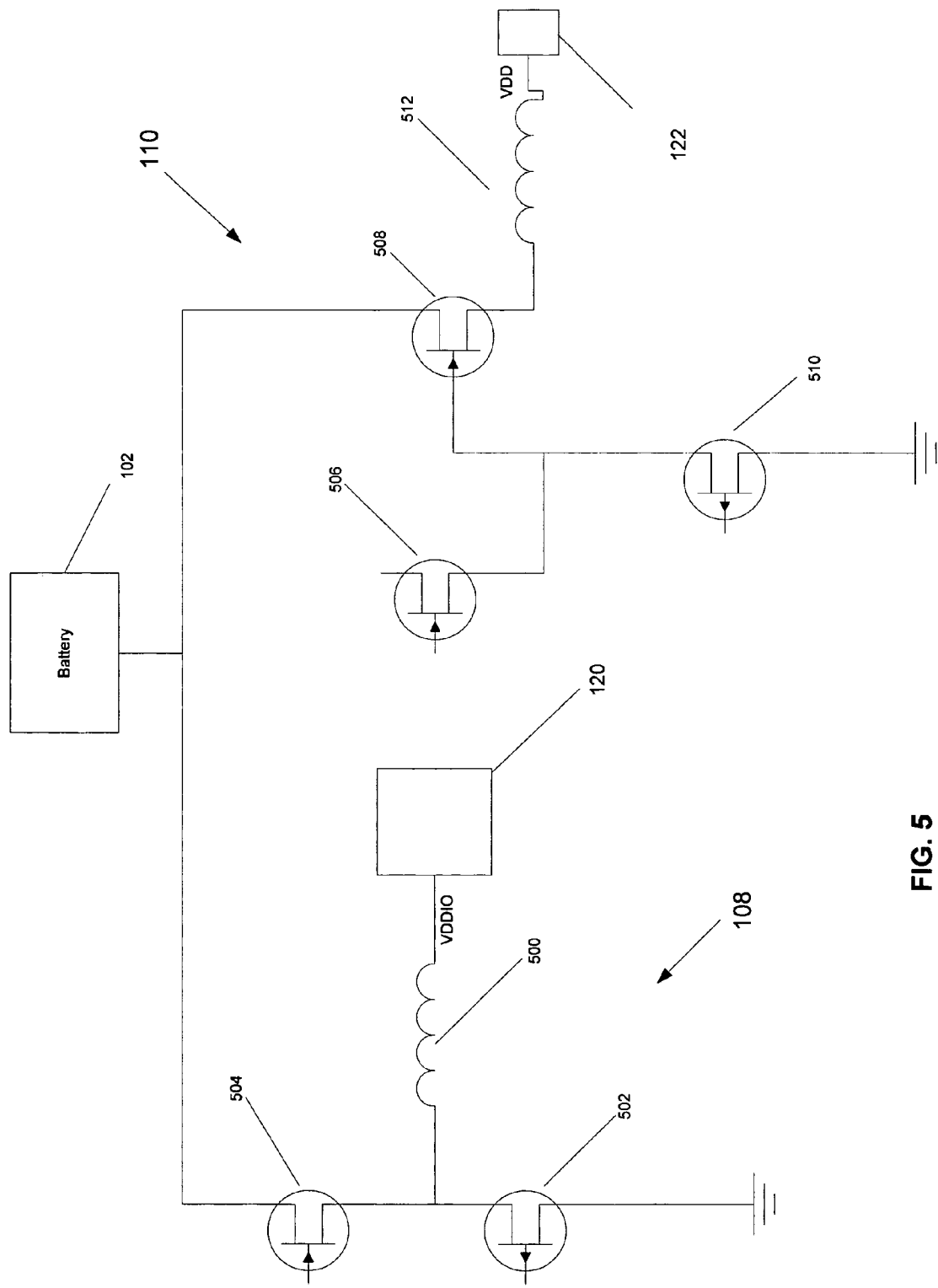
FIG. 5 is a circuit diagram of a pair of DC-DC converters in a buck-buck mode.

Referring to FIG. 5, a particular embodiment of the first DC-DC converter 108 and the second DC-DC converter 110 in a buck-buck mode is illustrated. The first DC-DC converter 108 includes an inductor 500, a transistor 502 and a transistor 504. The inductor 500 is coupled to the I/O pin 120 and to a node formed by the transistors 502 and 504. The transistor 502 is coupled to ground, and the transistor 504 is coupled to the battery 102. The inductor 500 provides the output voltage VDDIO to the I/O pin 120.

The second DC-DC converter 110 includes transistors 506, 508 and 510. The node formed by the connection of the transistors 506, 508 and 510 is coupled to an inductor 512. The inductor 512 provides the supply voltage VDD to the integrated circuit 100. The transistor 508 is coupled to the battery 102. The transistor 510 is coupled to ground. In this configuration, the voltage VDD is provided to the I/O pin 122.

Figure 6:
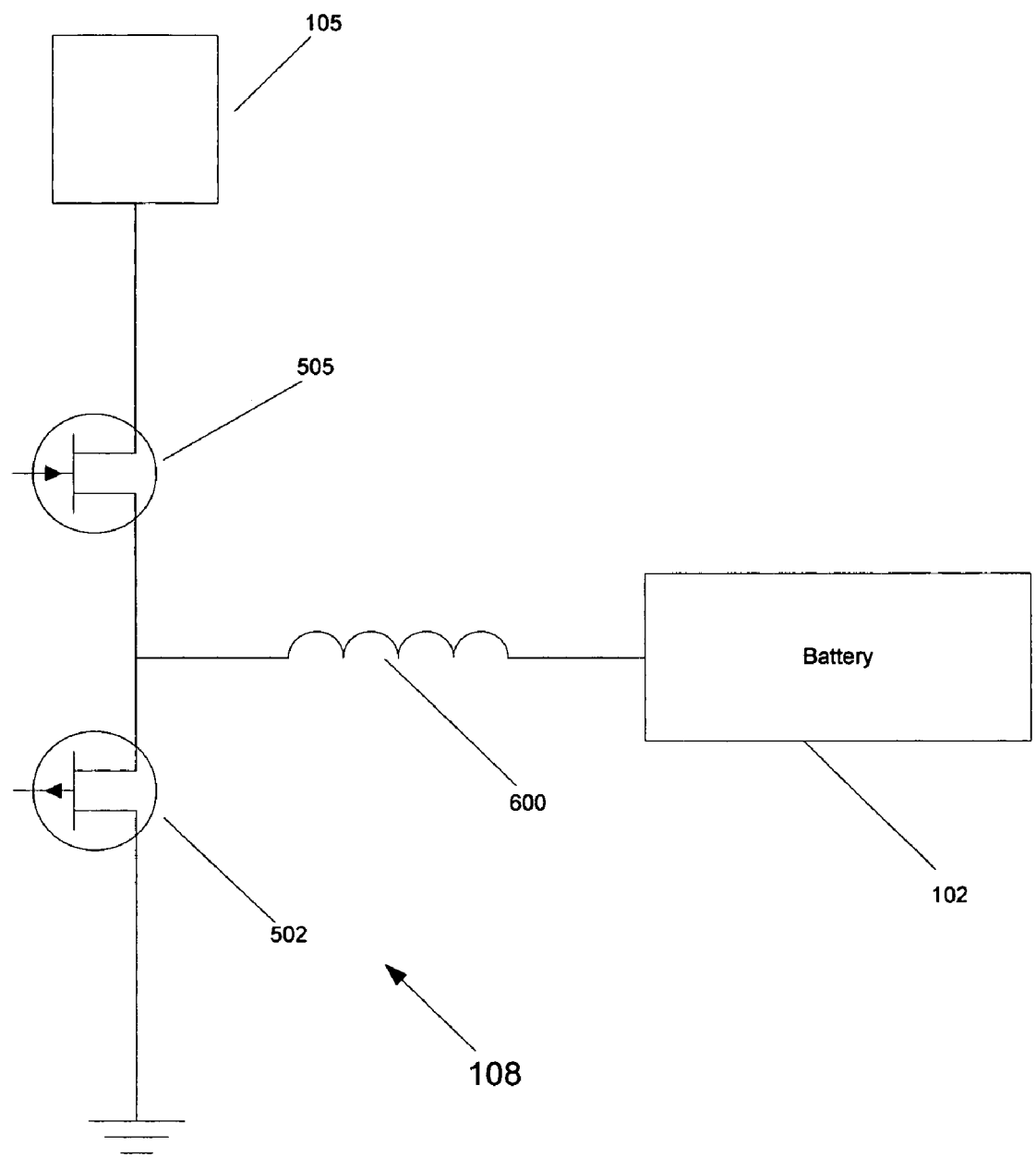
FIG. 6 is a circuit diagram of a DC-DC converter in a boost mode.

Referring to FIG. 6, a particular embodiment of the first DC-DC converter 108 in a boost mode is illustrated. In this embodiment, the transistor 504 is coupled to the I/O pin 120. The transistor 504 provides the output voltage VDDIO to the I/O pin 120. Inductor 600 is coupled to the battery 102. In this configuration, the voltage applied by the battery 102 is boosted and provided at the I/O pin 105.

FIGS. 5 and 6 illustrate exemplary embodiments of inductor based switching converters. It will be appreciated by those skilled in the art that other types of converters may be used, including linear regulators, switched capacitor converters, or other appropriate converter.

Figure 7:
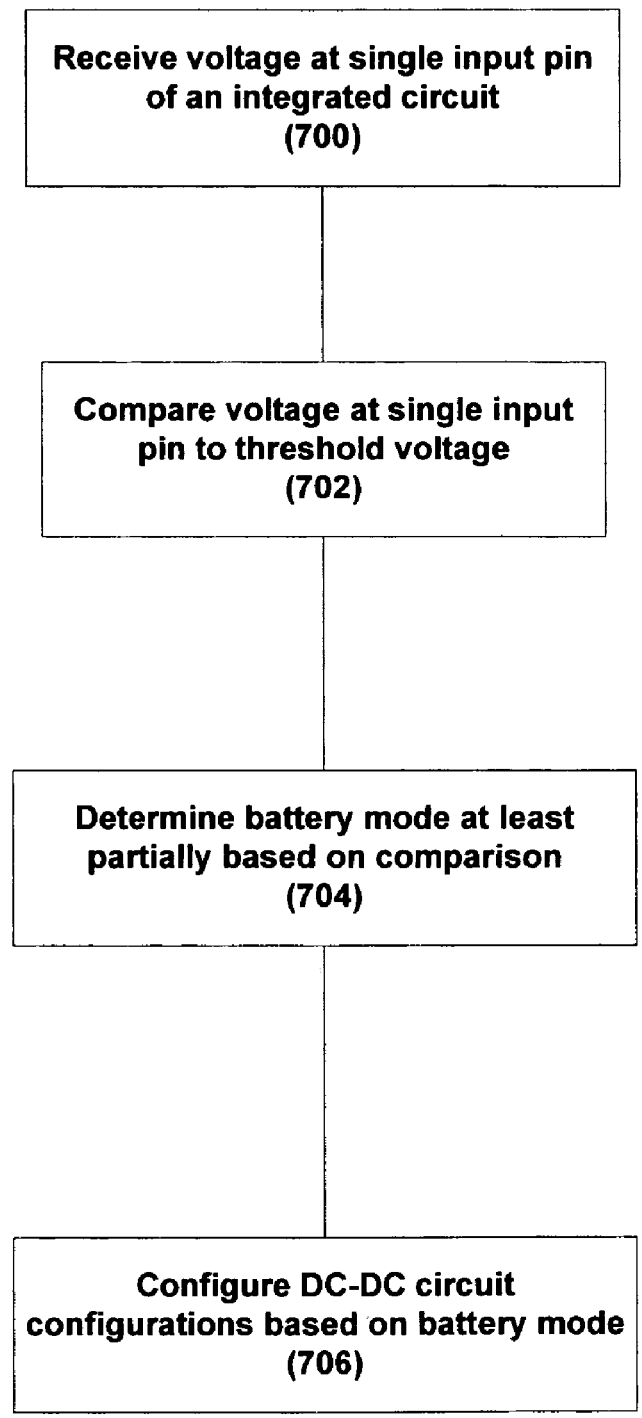
FIG. 7 is a flowchart illustrating a particular embodiment of a method of determining the battery mode of an integrated circuit device.

Referring to FIG. 7, a particular embodiment of a method of determining the battery mode of an integrated circuit device is illustrated. At step 700, a voltage level at a single input pin is received. The voltage level at this single input pin is compared to a target voltage at step 702. In a particular embodiment, the voltage at the single input pin may be based on an impedance value sensed at the single input pin. At least partially based on the comparison at step 702, a battery mode is determined at step 704. In a particular embodiment, the battery mode is determined using logic elements coupled to the output of a comparator. In a particular embodiment, the battery mode is identified by a three bit digital value that identifies one of four available battery modes. For example, the battery mode detection module 302 as described herein may determine up to four different battery modes. At step 706, one or more DC-DC circuits are configured. The configuration of the DC-DC converters depend on the battery mode determined at step 704.

The disclosed system and method can be used to reduce costs of an integrated circuit by use of a single pin to detect three or more different battery types. Based on the detected battery types, multiple DC-DC converter circuits can be arranged in various configurations to provide for a flexible and reusable circuit design.

The above disclosed subject matter is to be considered illustrative, and not restrictive, and the appended claims are intended to cover all such modifications, enhancements, and other embodiments which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An integrated circuit comprising:
   a plurality of pins;
   a first direct current to direct current converter arranged in a first selectable configuration corresponding to a selected battery mode determined in response to an input received at one of the plurality of pins; and
   a second direct current to direct current converter arranged in a second selectable configuration based on the selected battery mode;
   wherein the selected battery mode is selected from at least three different available battery modes and wherein when the selected battery mode is a first mode, the first selectable configuration is a first buck configuration and the second selectable configuration is a second buck configuration, and when the selected battery mode is a second mode, the first selectable configuration is the first buck configuration and the second selectable configuration is a boost configuration.

2. The integrated circuit of claim 1, wherein the selected battery mode is selected from four available battery modes.

3. The integrated circuit of claim 2, wherein the available battery modes includes a lithium ion battery mode, an alkaline battery mode, and a double A battery mode.

4. The integrated circuit of claim 3, wherein the available battery modes further includes a second lithium ion battery mode.

5. The integrated circuit of claim 1, wherein when the selected battery mode is a third mode, the first selectable configuration is the boost configuration and the second selectable configuration is an off configuration.

6. The integrated circuit of claim 1, wherein the first buck configuration comprises a first transistor coupled to a battery and coupled to a first inductor, and a second transistor coupled to the first transistor and coupled to ground.

7. The integrated circuit of claim 6, wherein the second buck configuration comprises a third transistor coupled to the battery and coupled to a second inductor, a fourth transistor coupled to the second inductor and coupled to ground, wherein the second inductor is coupled to an output voltage.

8. The integrated circuit of claim 1, wherein the boost configuration comprises a first transistor coupled to an output voltage and coupled to an inductor, wherein the inductor is coupled to a battery, and a second transistor coupled to the inductor and coupled to ground.

9. The integrated circuit of claim 1, wherein the at least three different available battery modes are identified by at least three digital bit values derived from an input applied to the one of the plurality of pins.

10. The integrated circuit of claim 9, wherein the at least three different available battery modes include a first mode associated with a lithium ion battery, the first mode detected when the input is at a low voltage level.

11. The integrated circuit of claim 10, wherein the at least three different available battery modes includes a fourth mode associated with a single series double A battery, the fourth mode detected when the input is at a high voltage level.

12. The integrated circuit of claim 11, wherein the at least three different available battery modes includes a second mode detected by a first intermediate voltage level and a third mode detected by a second intermediate voltage level.

13. The integrated circuit of claim 12, wherein the second mode corresponds to a series coupled double A battery.

14. The integrated circuit of claim 1, further comprising a battery mode detection module coupled to the one of the plurality of pins to receive an input voltage.

15. The integrated circuit of claim 14, wherein the battery mode detection module includes a comparator that is powered down in two of the battery modes to conserve power.

16. A method of selecting a battery mode with respect to a first direct current to direct current converter circuit configuration and a second direct current to direct converter current circuit configuration within an integrated circuit, the method comprising:
   receiving a voltage at a single pin of the integrated circuit;
   determining a battery mode based on the voltage received at the single pin, the battery mode selected from one of at least three different battery modes; and
   configuring at least one of the direct current to direct current converter circuit configurations based on the selected battery mode;
   placing the first direct current to direct current converter circuit in a first configuration; and
   placing the second direct current to direct current converter circuit in a second configuration;
   wherein the first and second configurations are selected based on the selected battery mode and wherein when the selected battery mode is a first mode, the first selectable configuration is a first buck configuration and the second selectable configuration is a second buck configuration, and when the selected battery mode is a second mode, the first selectable configuration is the first buck configuration and the second selectable configuration is a boost configuration.

17. The method of claim 16, wherein when the selected battery mode is a third mode, the first selectable configuration is the boost configuration and the second selectable configuration is an off configuration.

18. The method of claim 16, wherein the selected battery mode is identified by a two bit digital value that identifies one of four available battery modes.

19. The method of claim 18, further comprising comparing the voltage received at the single pin to a target voltage and determining the selected battery mode at least partially based on the comparison.

20. The method of claim 19, further comprising determining the battery mode using logic elements coupled to an output of a comparator.

* * * * *